US007137855B2

(12) United States Patent
Koughan et al.

(10) Patent No.: US 7,137,855 B2
(45) Date of Patent: Nov. 21, 2006

(54) MECHANICAL ADAPTER FOR CIRCUITRY MODULES

(75) Inventors: James P. Koughan, Liberty Hill, TX (US); Jason B. Habingreither, Cedar Park, TX (US); Darryl D. Daniel, Austin, TX (US); Michel G. Haddad, Beirut (LB)

(73) Assignee: National Instruments Corporation, Austin, TX (US)

( * ) Notice: Subject to any disclaimer, the term of this patent is extended or adjusted under 35 U.S.C. 154(b) by 7 days.

(21) Appl. No.: 11/037,568

(22) Filed: Jan. 18, 2005

(65) Prior Publication Data

US 2005/0231928 A1 Oct. 20, 2005

Related U.S. Application Data

(60) Provisional application No. 60/562,880, filed on Apr. 16, 2004.

(51) Int. Cl.
*H01R 11/20* (2006.01)
(52) U.S. Cl. .................... 439/928.1; 439/64; 439/377; 361/796; 361/685
(58) Field of Classification Search ............... 361/685, 361/796; 439/928.1, 64, 377
See application file for complete search history.

(56) References Cited

U.S. PATENT DOCUMENTS 5,673,171 A * 9/1997 Varghese et al. ............ 361/685
5,959,847 A * 9/1999 McMillian et al. ......... 361/796
6,195,266 B1 * 2/2001 Padgett et al. .............. 361/799
6,608,755 B1 8/2003 Baldwin et al.
2004/0201956 A1 10/2004 Conway

OTHER PUBLICATIONS

U.S. Appl. No. 11/075,459, filed Mar. 9, 2005, Richard G. Baldwin, Jr.

* cited by examiner

*Primary Examiner*—Truc Nguyen
(74) *Attorney, Agent, or Firm*—Meyertons Hood Kivlin Kowert & Goetzel, P.C.; Jeffrey C. Hood; Russell E. Henrichs

(57) ABSTRACT

In some embodiments, a mechanical adapter may be used to couple a first circuit board (e.g., a motherboard) to a second circuit board (e.g., a daughtercard) in a module. The mechanical adapter may have a mounting portion and a configurable portion. In some embodiments, the mounting portion may be similar for multiple configurations of the mechanical adapter. In various embodiments, the motherboard may be similar for different modules. For example, the mechanical adapter may be configured to mount a specific type of daughtercard in the configurable portion, while the mounting portion may be similar to mounting portions on other mechanical adapters with different configurations for different daughtercards (e.g., the motherboard may be similar for each of the different configurations). Therefore, in various embodiments, a common mounting portion may mate to a common motherboard configuration for different products each configured to mount a different daughtercard.

36 Claims, 20 Drawing Sheets

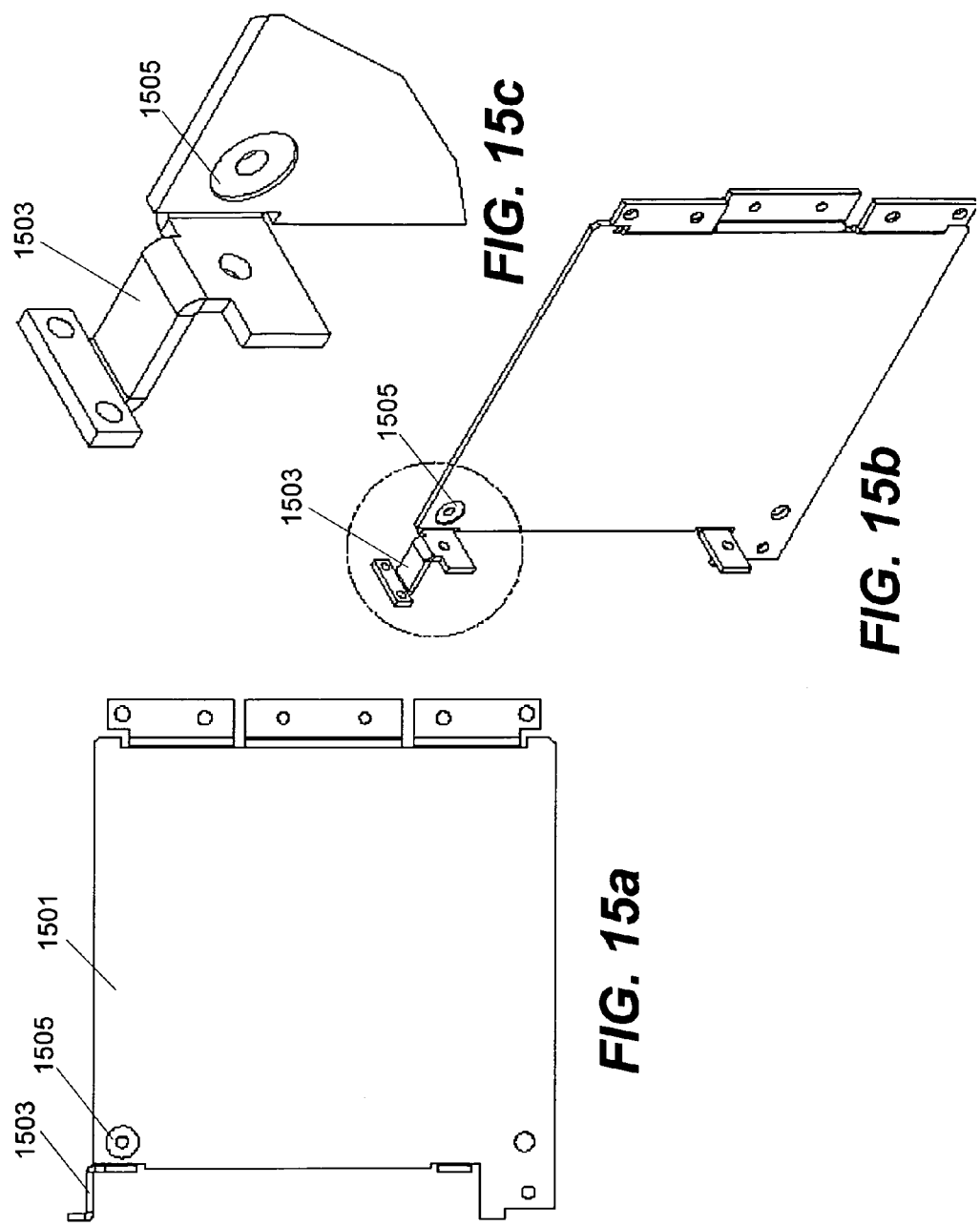

MECHANICAL ADAPTER FOR CIRCUITRY MODULES

PRIORITY DATA

This application claims benefit of priority of U.S. provisional application Ser. No. 60/562,880 titled "Mechanical Interface for Circuitry Modules" filed Apr. 16, 2004, whose inventors are James P. Koughan, Jason B. Habingreither, Darryl D. Daniel, and Michel G. Haddad.

BACKGROUND OF THE INVENTION

1. Field of the Invention

This invention relates generally to computer hardware and, more particularly, to circuit card mounting hardware.

2. Description of the Related Art

Printed circuit board (PCB) materials are typically made of inflexible laminates containing conductive layers with successive combinations of insulating layers. Conductive layers may include copper metal, or another conductive material. Conductive layers of the PCB may be used to transport electrical energy within the laminate. Insulating layers may include glass-fiber reinforced epoxy resins or other insulating materials.

The conductive circuits of the PCB may reside in a limited area of the PCB's form. The rest of the form may have the same laminate, however, with the conductive material etched away. The portion cleared of conductive material may be used for mechanical adapting and may not serve an electrical function. The PCB may be exposed to an etching bath to remove copper from a front of the PCB, creating an imbalance of conductive material within or on the PCB (e.g., high copper content on rear 20% of a PCB's volume and zero copper content on the remaining 80% of the PCB's volume). Long exposure times to the etching bath may cause poor circuit trace quality and/or PCB warping. Differences in conductive material content across the PCB may result in differences in thermal expansion coefficients of the different materials in the PCB. The differences in the thermal expansion coefficients may result in PCB warping when the PCB is reheated during electrical component-level device assembly to a PCB surface.

Many traditional PCB laminates may be composed of interwoven glass fibers held rigidly in a matrix of cured resin, usually a thermosetting epoxy, resulting in a structure that allows for extremely limited plastic deformation. As a result, mechanical features that can be created in such a material may be limited to simple cuts with all the limitations inherent to a machined feature.

SUMMARY OF THE INVENTION

In some embodiments, a mechanical adapter may be used in place of some printed circuit board (PCB) materials. For example, some PCB materials may not be well suited to mechanically support secondary form factors. The mechanical adapter may include a metal superstructure adapted to fit different form factors using traditional metalworking fabrication processes. In some embodiments, the mechanical adapter may have a common mechanical interface on a side to receive a reusable, common form factor card (e.g., a motherboard). In various embodiments, the mechanical adapter may be reconfigured to adapt to multiple form factors while maintaining preexisting overall form factor constraints.

In some embodiments, a mechanical adapter may have a mounting portion and a configurable portion. The mounting portion may be operable to couple to a circuit board. In some embodiments, the mounting portion may be similar for multiple configurations of the mechanical adapter. In some embodiments, the circuit board may be similar for different modules. The configurable portion may be coupled to the mounting portion and may operate to extend the combined mechanical adapter/circuit board combination, such that when the combination is inserted into a chassis, the combined mechanical adapter/circuit board extends the full length of the chassis slot. Circuit boards may be used with multiple different products using similar form factors. For example, the mechanical adapter may be configured to adapt the circuit board to a needed form factor for a specific PXI module. In various embodiments, the mechanical adapter may be configured to adapt the circuit board to a needed form factor for a specific SCXI module. While embodiments are shown for PXI modules and SCXI modules, it is to be understood that the mechanical adapter may also be used for other modules and other products besides PXI modules and SCXI modules.

In various embodiments, a second circuit board (e.g., a module daughtercard) may be mounted onto a mechanical adapter to be coupled to a first circuit board (e.g., a motherboard). For example, the mechanical adapter may be configured to mount a specific type of daughtercard in the configurable portion, while the mounting portion may be similar to mounting portions on other mechanical adapters with different configurations for different daughtercards (e.g., the motherboard may be similar for each of the different configurations). Therefore, in various embodiments, a common mounting portion may mate to a common motherboard configuration for different products each configured to mount a different daughtercard. The mechanical adapter may also be used with other circuitry elements besides a motherboard and a daughtercard. For example, the mechanical adapter may be used to align and couple other PCBs.

In some embodiments, protrusions may substantially align with slots on the first circuit board to align the mechanical adapter with the first circuit board. For example, the protrusions may snap into slots to align outer edges of the first circuit board and the mechanical adapter. In some embodiments, holes on the mounting portion of the mechanical adapter may align with corresponding holes on the first circuit board. In some embodiments, fasteners may be placed through the holes of the mechanical adapter and the first circuit board when the holes on each are substantially aligned. For example, a fastener (e.g., a screw or a rivet) may be placed through holes on the first circuit board and the mechanical adapter to couple the first circuit board to the mechanical adapter.

In some embodiments, tabs may be offset from the plane of the mechanical adapter to receive the daughtercard. In some embodiments, tabs may be used to offset the daughtercard in any direction (e.g., along the x, y, and/or z directions). For example, the depth of the offset may be adjusted according to an overall width of the daughtercard. In some embodiments, the tabs may be offset to substantially align a surface of a daughtercard with a surface of the mechanical adapter. In some embodiments, the tabs may be offset to substantially align an electrical connector on the daughtercard with an electrical connector on the motherboard. In some embodiments, an offset of the tabs may be configured such that the maximum overall width of a motherboard/daughtercard assembly, when the daughtercard is coupled to the mechanical adapter, is within a predetermined value. In some embodiments, offsetting tabs may be used to fit in components that would otherwise be too wide to place on a daughtercard mounted in the same plane as the motherboard or mechanical adapter.

BRIEF DESCRIPTION OF THE DRAWINGS

The foregoing, as well as other objects, features, and advantages of this invention may be more completely understood by reference to the following detailed description when read together with the accompanying drawings in which:

FIGS. 15a, 15b, and 15c illustrate a mechanical adapter with a complex bent tab, according to an embodiment;

Figure 1A:
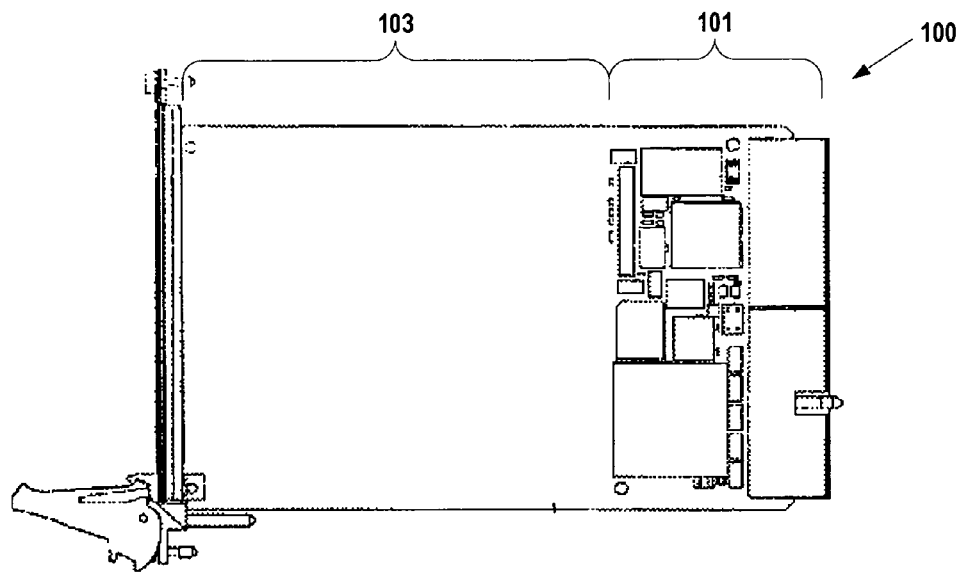
FIG. 1a illustrates a Peripheral Component Interconnect (PCI) Extensions for Instrumentation (PXI) module.

While the invention is susceptible to various modifications and alternative forms, specific embodiments thereof are shown by way of example in the drawings and will herein be described in detail. It should be understood, however, that the drawings and detailed description thereto are not intended to limit the invention to the particular form disclosed, but on the contrary, the intention is to cover all modifications, equivalents, and alternatives falling within the spirit and scope of the present invention as defined by the appended claims. Note, the headings are for organizational purposes only and are not meant to be used to limit or interpret the description or claims. Furthermore, note that the word "may" is used throughout this application in a permissive sense (i.e., having the potential to, being able to), not a mandatory sense (i.e., must). The term "include", and derivations thereof, mean "including, but not limited to". The term "coupled" means "directly or indirectly connected".

DETAILED DESCRIPTION OF THE EMBODIMENTS

In some embodiments, a mechanical adapter may be used in place of some printed circuit board (PCB) materials. For example, some PCB materials may not be well suited to mechanically support secondary form factors. The mechanical adapter may include a metal superstructure adapted to fit different form factors using traditional metalworking fabrication processes. In some embodiments, the mechanical adapter may have a common mechanical interface on a side to receive a reusable, common form factor card (e.g., a motherboard). In various embodiments, the mechanical adapter may be reconfigured to adapt to multiple form factors while maintaining preexisting overall form factor constraints.

In some embodiments, areas of the PCB form factor with conductive circuits may be decoupled from areas devoid of conductive material to reduce or eliminate PCB warping. In some embodiments, the area devoid of conductive material may be replaced with a flexible material that may be shaped into different three-dimensional geometries to support a wide variety of secondary PCBs. In some embodiments, a reduced size form factor may be used for the conductive circuit PCB portion along with a mechanical adapter in place of the areas that do not typically have conductive circuits, to create a PCB with less warping problems.

In some embodiments, the mechanical adapter may be metal (e.g., sheet metal). Other materials may also be used for the mechanical adapter. In some embodiments, the mechanical adapter may be fabricated (e.g., cut, bent, and/or stamped). While, in some embodiments, auxiliary hardware may be coupled to the mechanical adapter, fabricating the mechanical adapter may lead to less auxiliary hardware being required. In some embodiments, the mechanical adapter may be configured to support multi-tiered, multi-PCB assemblies.

Figure 1B:
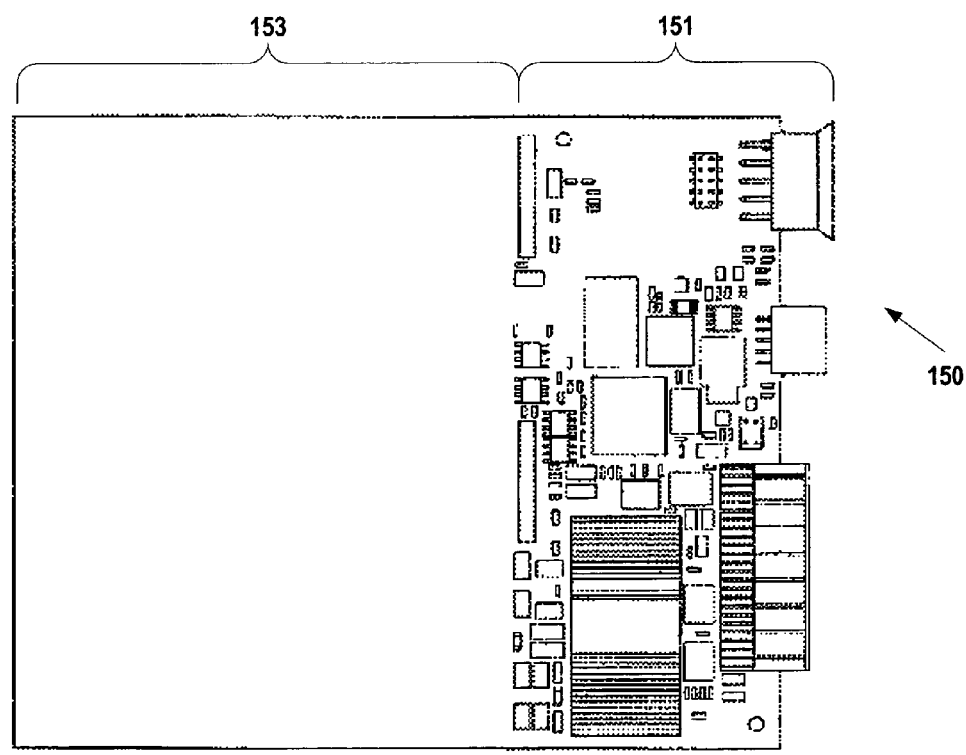
FIG. 1b illustrates a Signal Conditioning Extensions for Instrumentation (SCXI) module.
Figure 1C:
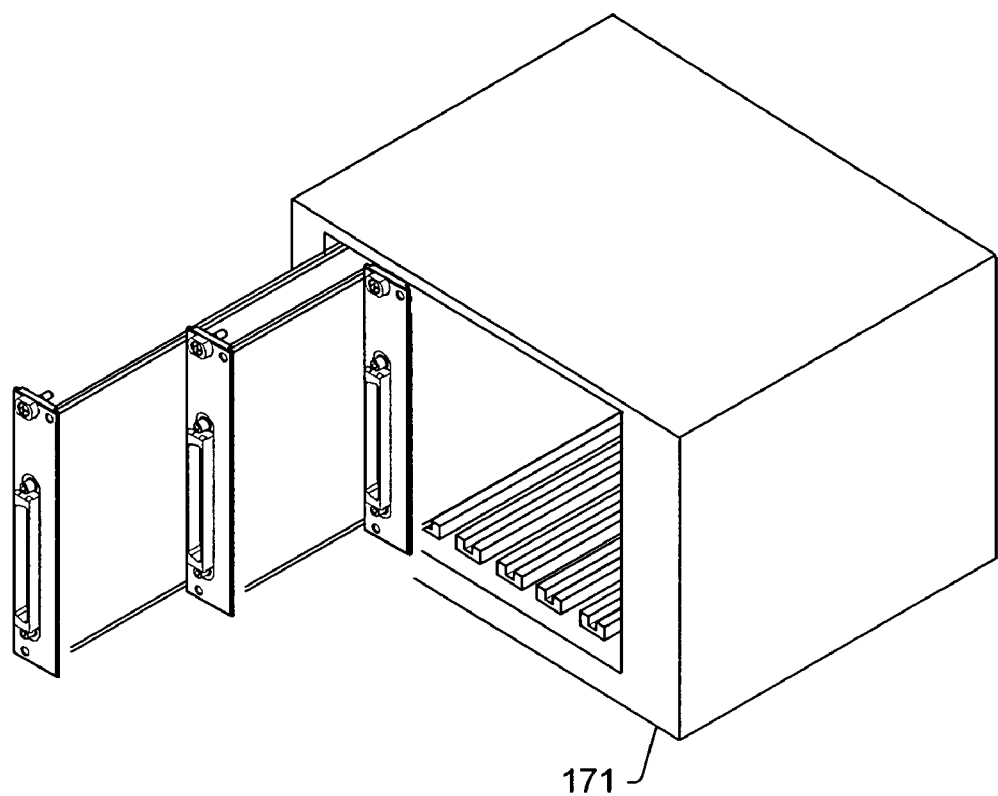
FIG. 1c illustrates a chassis for a PXI module.
Figure 1D:
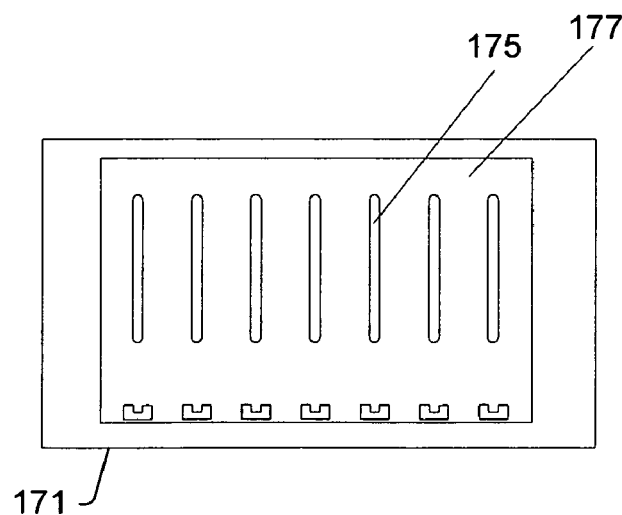
FIG. 1d illustrates a front view of a chassis.
Figure 2:
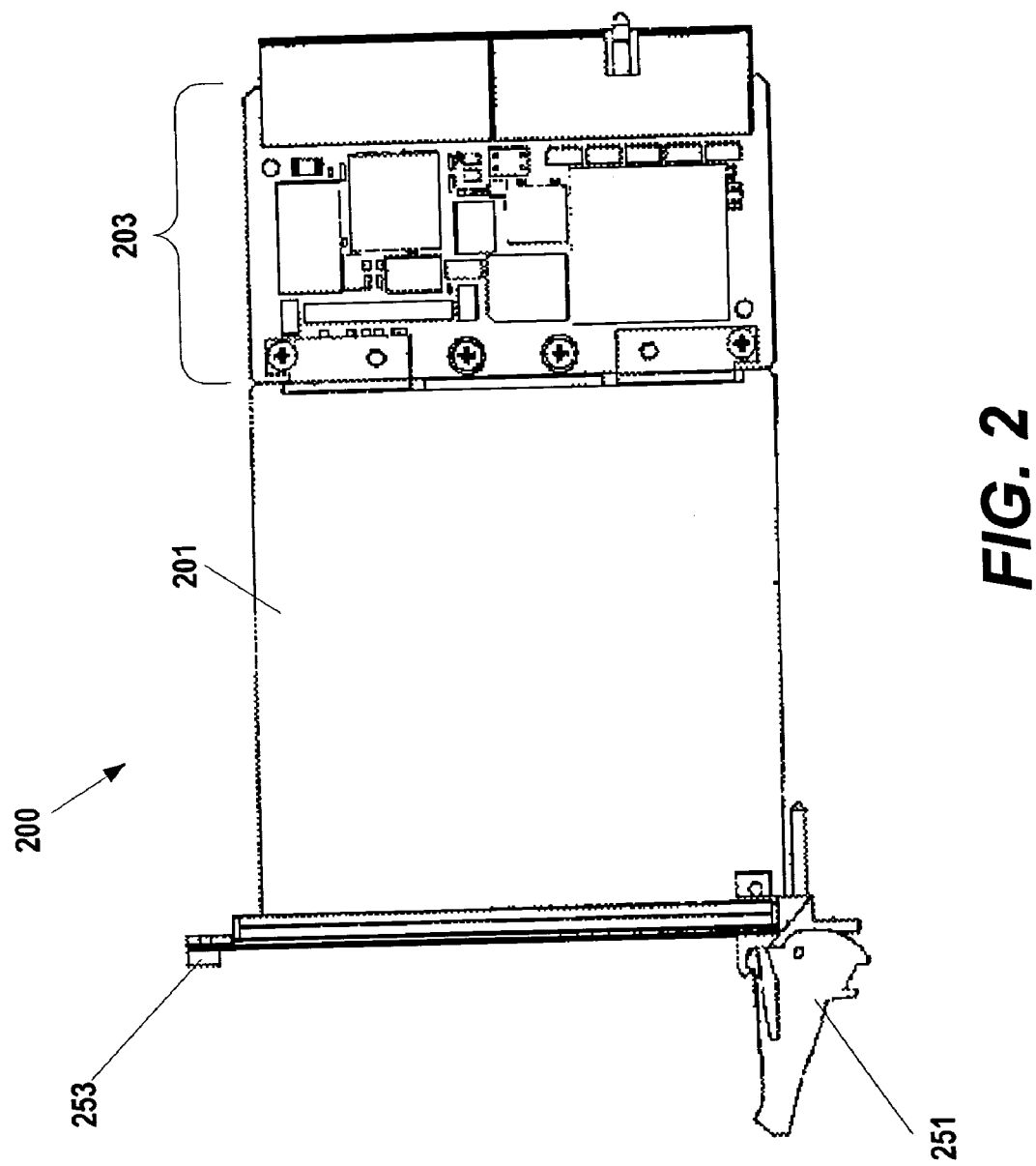
FIG. 2 illustrates a PXI module with a mechanical adapter, according to an embodiment.
Figure 3:
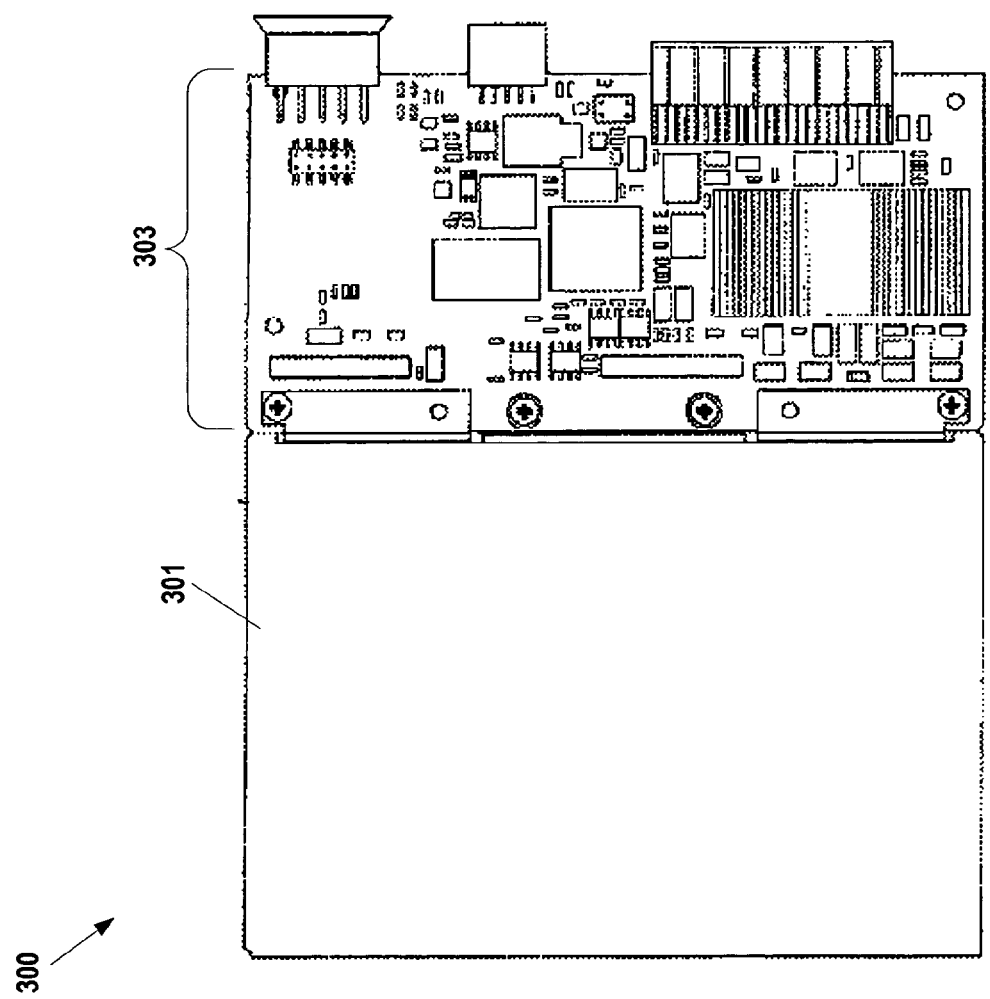
FIG. 3 illustrates a SCXI module with a mechanical adapter, according to an embodiment.

In various embodiments, a module may have separate PCBs for analog circuitry and digital circuitry. In some embodiments, the digital circuitry may reside on a motherboard (i.e., a first circuit board) and the analog circuitry may reside on an analog daughtercard (i.e., a second circuit board). In some embodiments, a common motherboard form factor may be used for multiple module designs for a given form factor. As seen in FIG. 1a, a Peripheral Component Interconnect (PCI) Extensions for Instrumentation (PXI) module 100 may have a substantially fiberglass portion 103 and circuitry 101. In some embodiments, the substantially fiberglass portion 103 may be replaced with a mechanical adapter 201 as seen with the PXI module 200 in FIG. 2. As seen in FIG. 1b, a Signal Conditioning Extensions for Instrumentation (SCXI) module 150 may have a substantially fiberglass portion 153 and circuitry 151. In some embodiments, the substantially fiberglass portion 153 may be replaced with a mechanical adapter 301 as seen with the SCXI module 300 in FIG. 3. In some embodiments, the circuitry may be a circuit board. In some embodiments, the mechanical adapter 201 may be designed to couple to a circuit board for insertion into a chassis 171 as seen in FIG. 1c. For example, the mechanical adapter 201 may be long enough such that a connector on the circuit board 203 can couple to a connector 175 on the back of the chassis 171 (e.g., on a backboard 177 of the chassis 171). In some embodiments, a front plate 253 may couple to a front of the mechanical adapter 201 to provide access to the mechanical adapter 201/circuit board 203 combination from the front of the chassis 171. In some embodiments, a configurable portion may have a length such that when the mechanical adapter 201/circuit board 203 combination is inserted into a slot of a chassis 171, the mechanical adapter 201/circuit board 203 combination extends a full length of the chassis slot. In some embodiments, when the mechanical adapter 201/circuit board 203 combination is inserted into a slot of a chassis, the circuit board connectors may mate with the corresponding connectors in the backplane of the chassis, and the front plate 253 and locking member 251 may engage the chassis.

In various embodiments, the circuit boards 203 and 303 may be used with multiple different products using similar form factors. For example, in various embodiments, the mechanical adapter 201 may be configured to adapt the circuit board 203 to a needed form factor for a specific PXI module. In other embodiments, the mechanical adapter 301 may be configured to adapt the circuit board 303 to a needed form factor for a specific SCXI module. While embodiments are shown for PXI modules and SCXI modules, it is to be understood that the mechanical adapter may also be used for other modules and other products besides PXI modules and SCXI modules. The mechanical adapter may also be used with other circuitry elements besides a motherboard and a daughtercard. For example, the mechanical adapter may be used to align and couple other PCBs.

Figure 4:
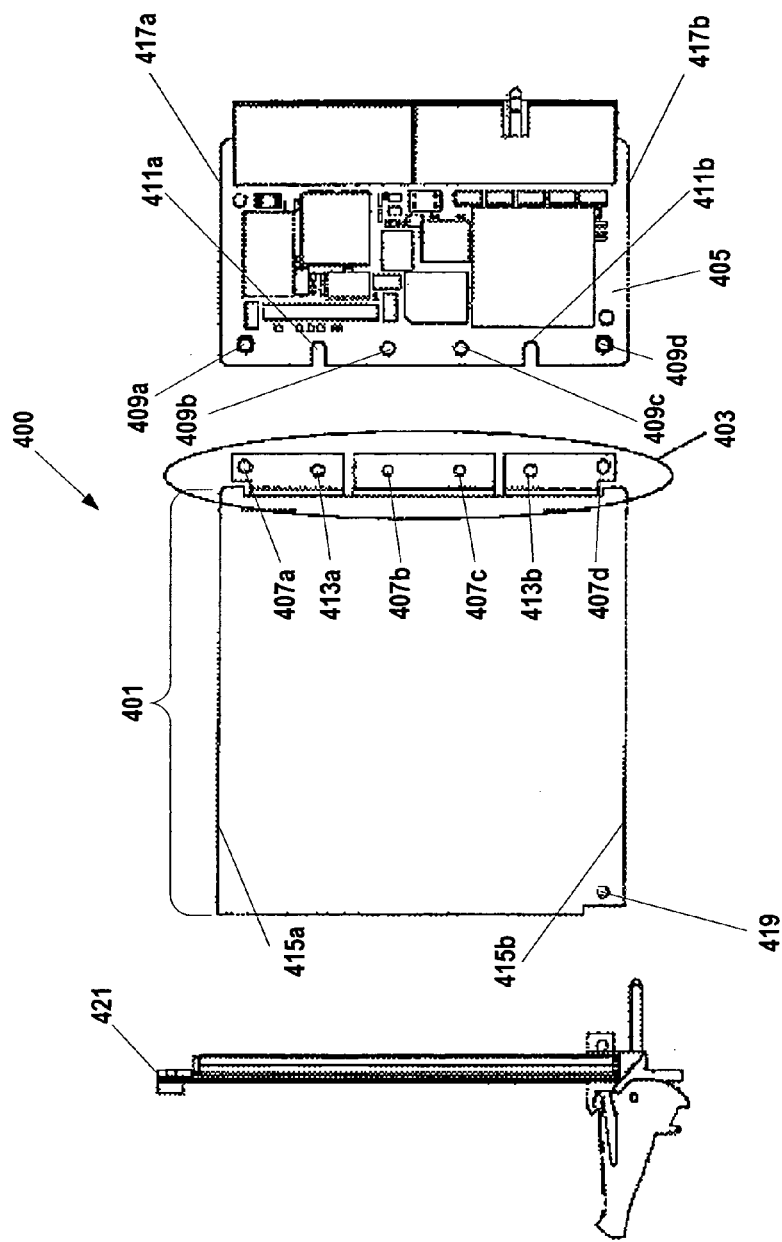
FIG. 4 illustrates an assembly of a PXI module containing a mechanical adapter, according to an embodiment.

FIG. 4 illustrates an embodiment of a mechanical adapter 400 for a PXI module. In some embodiments, the mechanical adapter 400 may have a configurable portion 401 and a mounting portion 403. In some embodiments, the mounting portion 403 may mount the mechanical adapter 400 to a circuit board 405. In some embodiments, the configurable portion 401 may position the circuit board 405 mounted to the mounting portion 403 in a chassis when the mechanical adapter 400/circuit board 405 assembly is inserted into the chassis. For example, the configurable portion 401 may be long enough to insure a good connection between the circuit board 405 and a backplane in the chassis. In some embodiments, the configurable portion 401 may be substantially parallel to the circuit board 405 (as seen in FIG. 4).

In some embodiments, protrusions 413 may substantially align with slots 411 on the circuit board 405 to align the mechanical adapter 400 with the circuit board 405. For example, the protrusions 413 may snap into slots 411 to align outer edges 415 with edges 417. In some embodiments, the protrusions 413 may be half shears that are partially stamped into the mechanical adapter 400. Other alignment mechanisms may also be used. In some embodiments, holes 407 on the mounting portion 403 of the mechanical adapter 400 may align with corresponding holes 409 on the circuit board 405. In some embodiments, fasteners may be placed through the holes of the mechanical adapter 400 and the circuit board 405 when the holes on each are substantially aligned. For example, hole 407a may be substantially aligned with hole 409a and a fastener (e.g., a screw or a rivet) may be placed through both. Other fastening mechanisms (e.g., adhesives and snaps) may also be used to fasten the configurable portion 401 to the circuit board 405. In some embodiments, brackets, and/or fasteners through holes (e.g. hole 419), may be provided on the mechanical adapter 400 to couple the mechanical adapter 400 to a front panel 421. Other fastening mechanisms are also contemplated.

Figure 5:
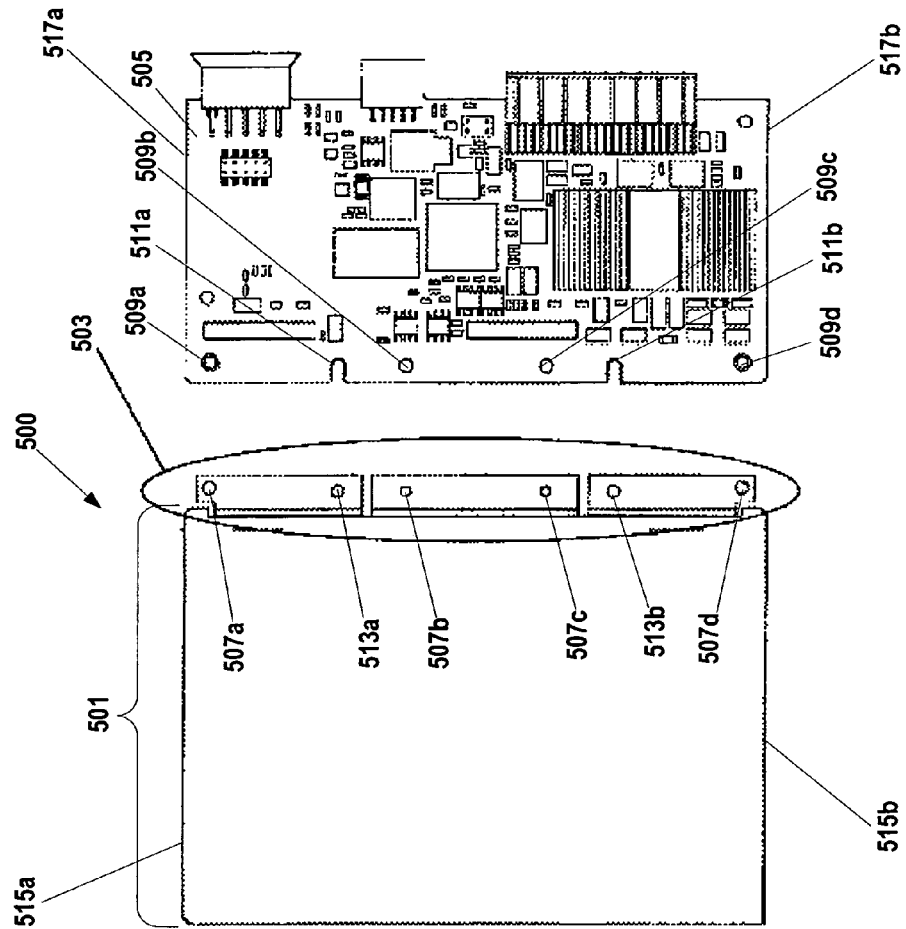
FIG. 5 illustrates an assembly of a SCXI module containing a mechanical adapter, according to an embodiment.

FIG. 5 illustrates an embodiment of a mechanical adapter 500 for a SCXI module. In some embodiments, the mechanical adapter 500 may have a configurable portion 501 and a mounting portion 503. In some embodiments, a circuit board 505 may mount to the mechanical adapter 500 through the mounting portion 503. The circuit board 505 and the mounting portion 503 may be similar for several embodiments, each with a different configuration for the configurable portion 501. In some embodiments, protrusions 513 may align with slots 511 to align outer edges 515 with edges 517. In some embodiments, fasteners may be placed through holes 507 and holes 509 when the holes are substantially aligned. Other fastening mechanisms may also be used to fasten the configurable portion 501 to the circuit board 505.

Figure 6:
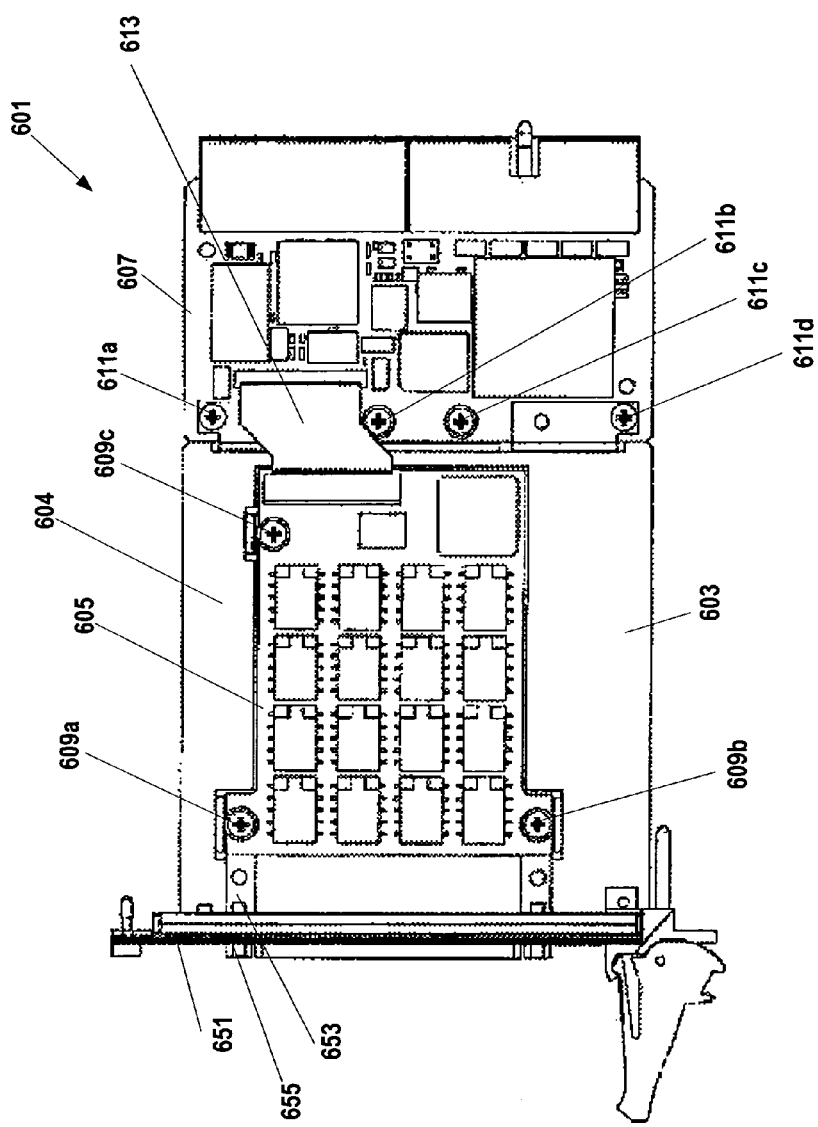
FIG. 6 illustrates a PXI module with a mechanical adapter for coupling a daughtercard to a motherboard, according to an embodiment.

FIG. 6 illustrates an embodiment of a PXI module 601 with a mechanical adapter 603 coupling a daughtercard 605 to a motherboard 607. In some embodiments, daughtercard 605 may be coupled to the mechanical adapter 603 through fasteners 609 (e.g., screws or rivets). The shape of the mechanical adapter 603 may be configured to fit the daughtercard 605 in the interior of the mechanical adapter 603. Other fasteners (e.g., adhesives) may also be used. In some embodiments, the mechanical adapter 603 may allow alignment between the daughtercard 605 and the front plate 651 to allow electrical connector 653, coupled to the daughtercard 605, to align with a receiving portion 655 (e.g., a hole) in the front plate 651. The mechanical adapter 603 may also be fabricated to allow the daughtercard 605 to be mounted on other planes relative to the motherboard 607 and front plate 651 for other alignments (e.g., other electrical connections). For example, a portion of the mechanical adapter 603 may be configured to offset the daughtercard 605 relative to a substantially planar surface (e.g., top surface 604) of the mechanical adapter 603 to align the daughtercard 605 with the motherboard 607 and/or front plate 651. In some embodiments, fasteners 611 may fasten the mechanical adapter 603 to the motherboard 607. An electrical connector (e.g., cable 613) may electrically couple the daughtercard 605 to the motherboard 607.

In some embodiments, a mounting portion may be similar for multiple configurations of the mechanical adapter 603. In various embodiments, the motherboard 607 may be similar for different PXI modules. For example, the mechanical adapter 603 may be configured to mount a specific type of daughtercard 605 in a configurable portion, while the mounting portion may be similar to mounting portions on other mechanical adapters with different configurations for different daughtercards (e.g., the motherboard may be similar for each of the different configurations). Therefore, in various embodiments, a common mounting portion may mate to a common motherboard configuration for different PXI products each configured to mount a different daughtercard.

Figure 7B:
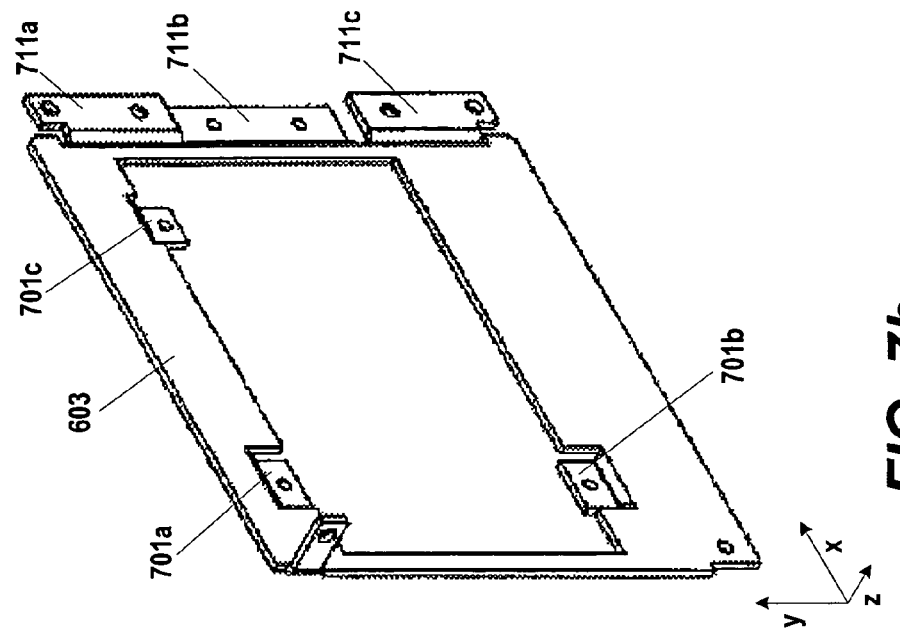
FIGS. 7a, 7b, and 7c illustrate views of a mechanical adapter for a PXI module, according to an embodiment.
Figure 7A:
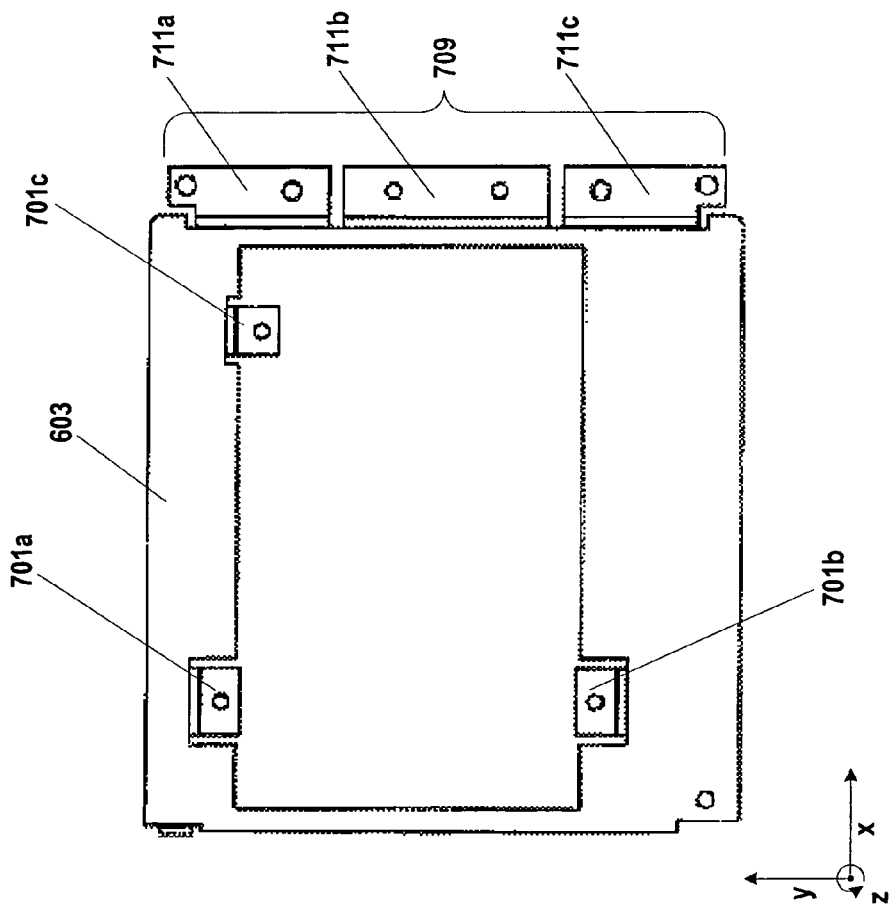
Figure 7C:
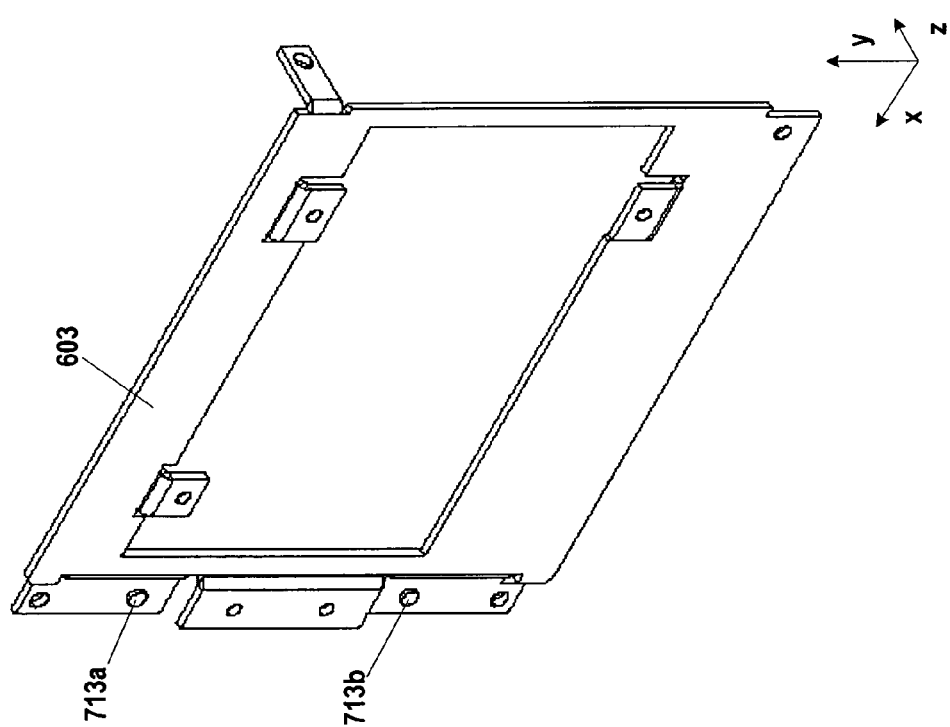

FIGS. 7a, 7b, and 7c illustrate an embodiment of a mechanical adapter 603 for a PXI module 601. In some embodiments, tabs 701 may be configured to receive a daughtercard (e.g., daughtercard 605 seen in FIG. 6). In some embodiments, tabs 701 may be used to offset the daughtercard 605 in any direction (e.g., along the x-axis, y-axis, and/or z-axis as seen in FIGS. 7a, 7b, and 7c). For example, as seen in the isometric view of the mechanical adapter 603 in FIG. 7b, the tabs 701 may be offset from the plane of the mechanical adapter 603 to receive the daughtercard 605. In some embodiments, the depth of the offset along the z-axis may be adjusted according to a width of the daughtercard 605. For example, the tabs 701 may be offset to substantially align a surface of a daughtercard 605 with a surface of the mechanical adapter 603. In some embodiments, the tabs 701 may be offset to substantially align an electrical connector 653 on the daughtercard 605 with a front plate 651 or with an electrical connector on the motherboard 607. In some embodiments, an offset of the tabs may be configured such that the maximum overall width of the PXI module 601 (e.g., a minimum overall dimension in the z-axis of the motherboard 607/daughtercard 605 assembly), when the daughtercard 605 is coupled to the mechanical adapter 603, is less than a predetermined value (e.g., less than 0.8 inches). For example, if the daughtercard 605 has an overall width of 0.7 inches, the daughtercard 605 may need to be centered (i.e., with half the overall width of the daughtercard 605 on either side of the mechanical adapter 603) such that the final overall width of the PXI module 601, including the daughtercard 605, tabs 701, etc., is less than 0.8 inches. In some embodiments, the overall width may need to be below a predetermined value to allow the daughtercard 605/motherboard 607 assembly to properly fit in a chassis (e.g., as seen in FIG. 1c) without contacting neighboring daughtercard/motherboard assemblies in the chassis. Other criteria may also be used in determining the number, placement, and offset of the tabs 701 on the mechanical adapter 603.

As seen in the isometric view of the mechanical adapter 603 in FIGS. 7a and 7b, the mounting portion 709 may have mounting tabs 711 which may be alternately offset on either side of the mechanical adapter 603. The motherboard 607 may fit between the alternately offset mounting tabs 711. In some embodiments, the alternately offset mounting tabs 711 may constrain the motherboard 607 along at least one dimension (e.g., in the z direction) to align the motherboard 607 with the mechanical adapter 603 (e.g., the motherboard 607 and mechanical adapter may be substantially aligned along the top and bottom surfaces of the mechanical adapter 603 and motherboard 607). Other configurations of the mounting portion 709 are also contemplated. For example, the mounting portion 709 may be one continuous tab which may be substantially coplanar with the mechanical adapter 603 or which may be offset to either side of the mechanical adapter 603. As seen in FIG. 7c, protrusions 713 may align with slots on the motherboard 607 for further alignment.

Figure 8:
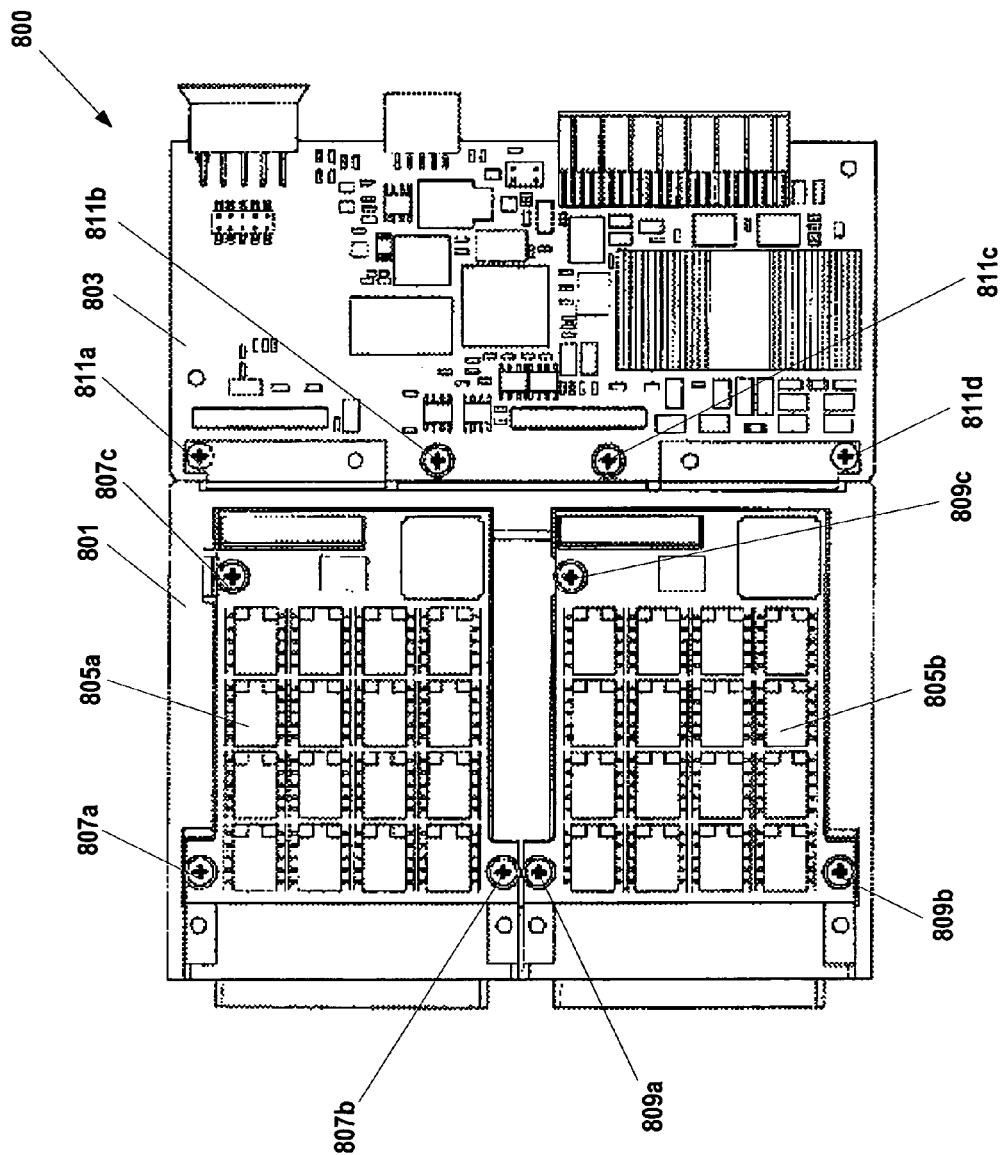
FIG. 8 illustrates a SCXI module with a mechanical adapter for coupling two daughtercards to a motherboard, according to an embodiment.

FIG. 8 illustrates an embodiment of a SCXI module 800 with a mechanical adapter 801 for coupling two daughtercards 805 to a motherboard 803. In some embodiments, the mechanical adapter 801 may be coupled to daughtercards 805a and 805b through fasteners 807 and 809, respectively. While two daughtercards 805 are shown, embodiments with one or more daughtercards are contemplated. In some embodiments, the mechanical adapter 801 may be coupled to the motherboard 803 through fasteners 811 (e.g., screws, rivets, and adhesives).

Figure 9B:
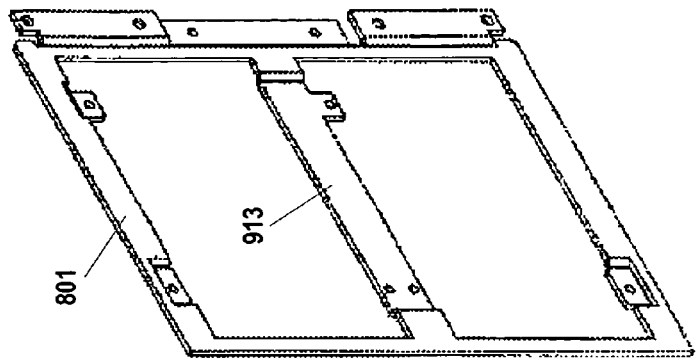
FIGS. 9a and 9b illustrate two views of a mechanical adapter for a SCXI module, according to an embodiment.
Figure 9A:
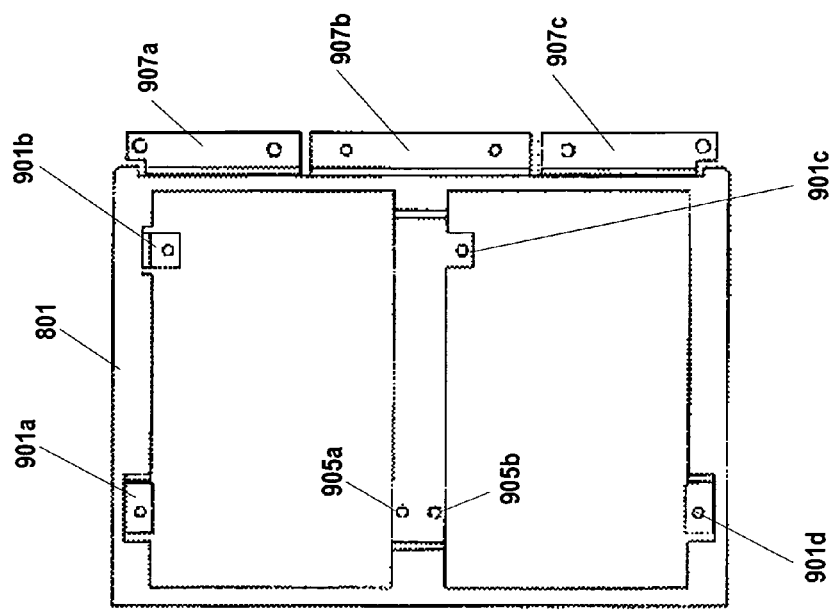

FIGS. 9a and 9b illustrate an embodiment of a mechanical adapter 801 for a SCXI module 800. In some embodiments, tabs 901 may be substantially aligned with holes on the daughtercards 805 to receive fasteners for fastening the daughtercards 805 to the mechanical adapter 801. In some embodiments, daughtercards 805 may be secured to parts of the mechanical adapter 801 without tabs (e.g., holes 905). As seen in the isometric views of FIGS. 9a and 9b, the tabs 901 may be offset. For example, the tab offsets may allow a surface of the daughtercards 805 to be substantially coplanar with a surface of the mechanical adapter 801 and/or a surface of the motherboard 803. In some embodiments, other portions of the mechanical adapter 801 (e.g., center strip 913) may be offset or in some other way modified to accommodate daughtercards 805. In some embodiments, the mounting portion may have mounting tabs 907 which may be alternately offset on either side of the mechanical adapter 801 to receive the motherboard 803. The motherboard 803 may fit in between the offsets and, therefore, may be supported on two sides by the mounting tabs 907. In some embodiments, the mounting tabs 907 may not be offset. In some embodiments, the mounting portion may have one continuous tab.

Figure 10A:
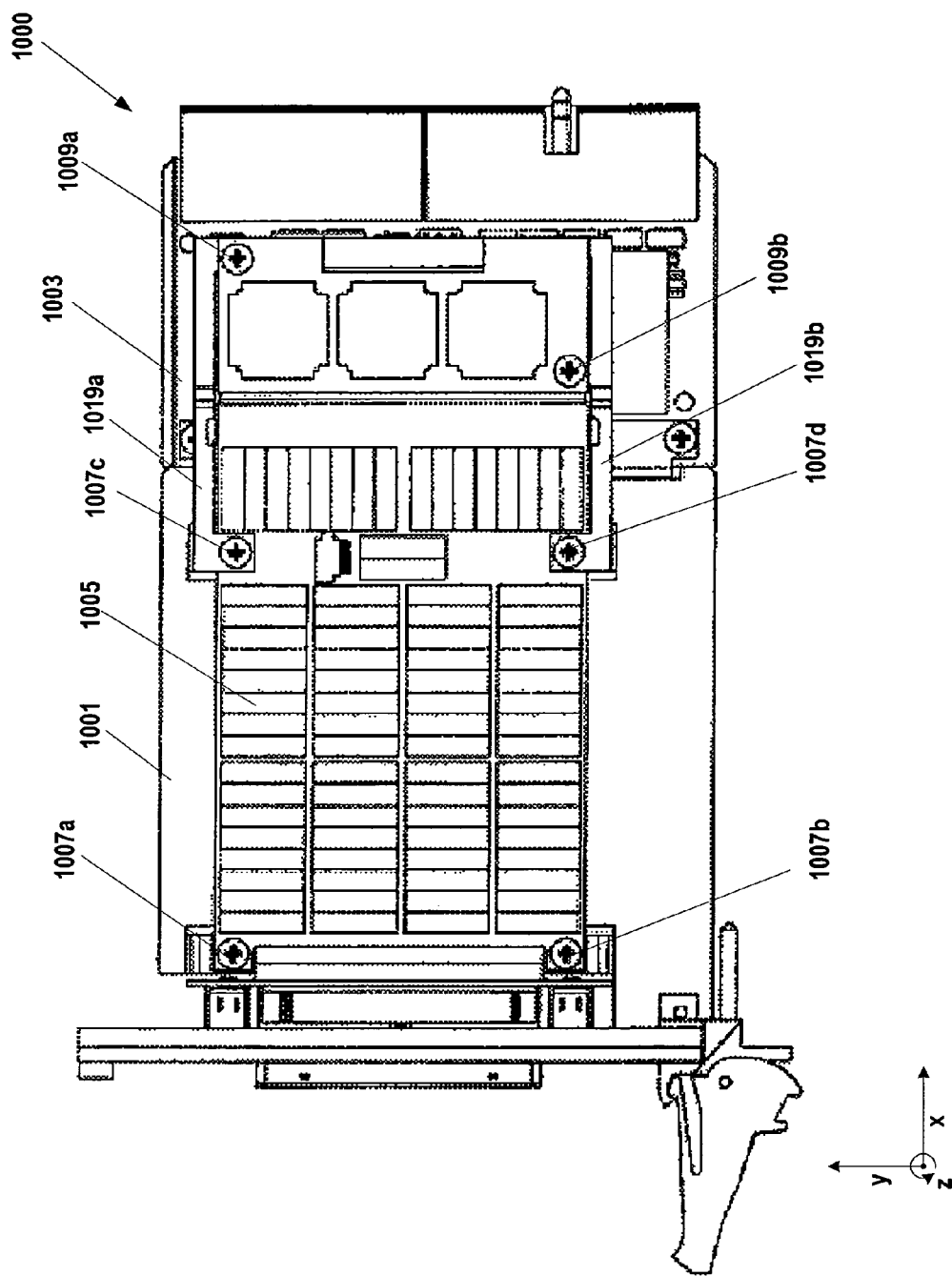
FIGS. 10a and 10b illustrate a PXI module with a multi-tiered daughtercard, according to an embodiment.
Figure 10B:
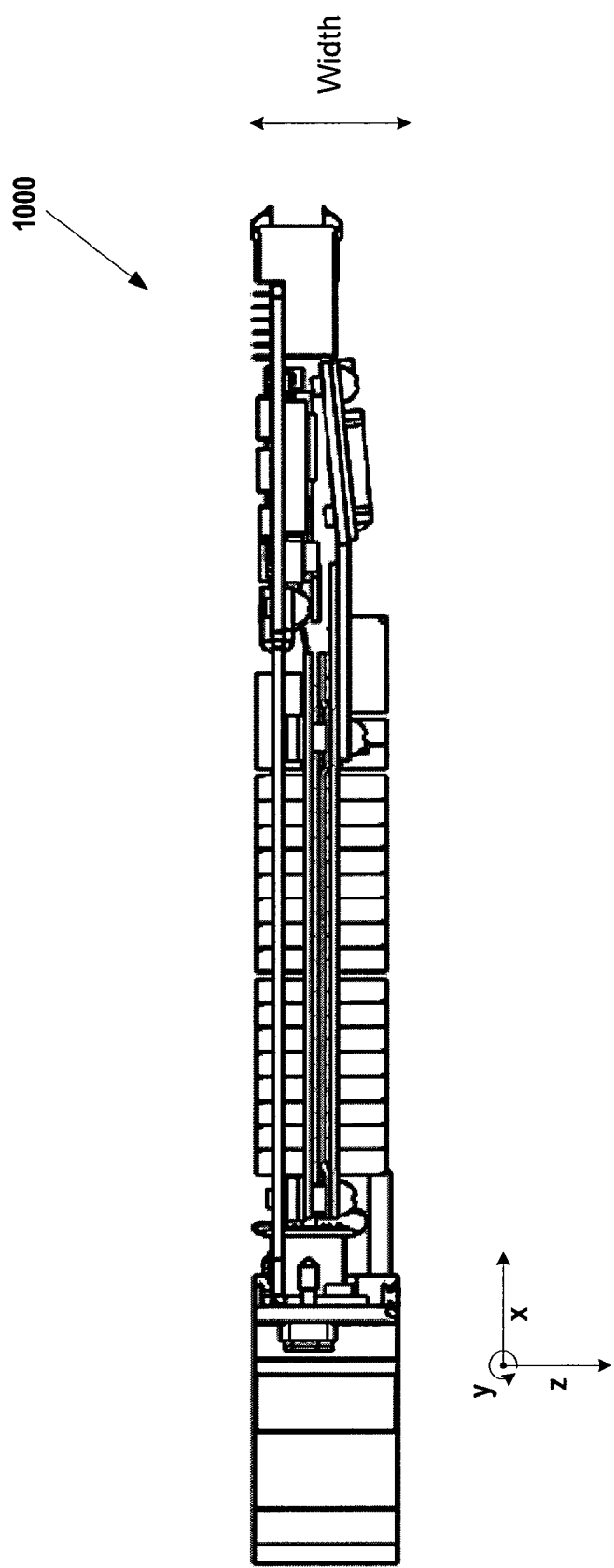

FIGS. 10a and 10b illustrate an embodiment of a PXI module 1000 with a multi-tiered daughtercard 1005. For example, multiple PCBs may be coupled together by flexible cables and folded on top of each other to form a multi-tiered daughtercard 1005. In some embodiments, the multi-tiered daughtercard 1005 may be relatively wide (e.g., along the z-axis). In some embodiments, the daughtercard 1005 may be fastened to a mechanical adapter 1001 and a motherboard 1003 through multiple fasteners. Additional pieces 1019a and 1019b may be attached through fasteners 1007c and 1007d, respectively, to provide additional support to the daughtercard 1005. The daughtercard 1005 may also be coupled to the mechanical adapter 1001 through fasteners 1007c and 1007d. Other additional pieces coupled to the mechanical adapter 1001 are also contemplated. In some embodiments, the daughtercard 1005 may be fastened to the mechanical adapter through fasteners 1007. In some embodiments, the daughtercard 1005 may also be fastened to the motherboard 1003. In some embodiments, multiple daughtercards may be stacked on top of each other. In some embodiments, multiple daughtercards may be attached linearly. As seen in FIG. 10b, tabs on the mechanical adapter may be offset to accommodate the overall width of the daughtercard. In some embodiments, the offset may prevent the daughtercard from contacting other circuit boards/adapters when installed in a chassis.

Figure 11B:
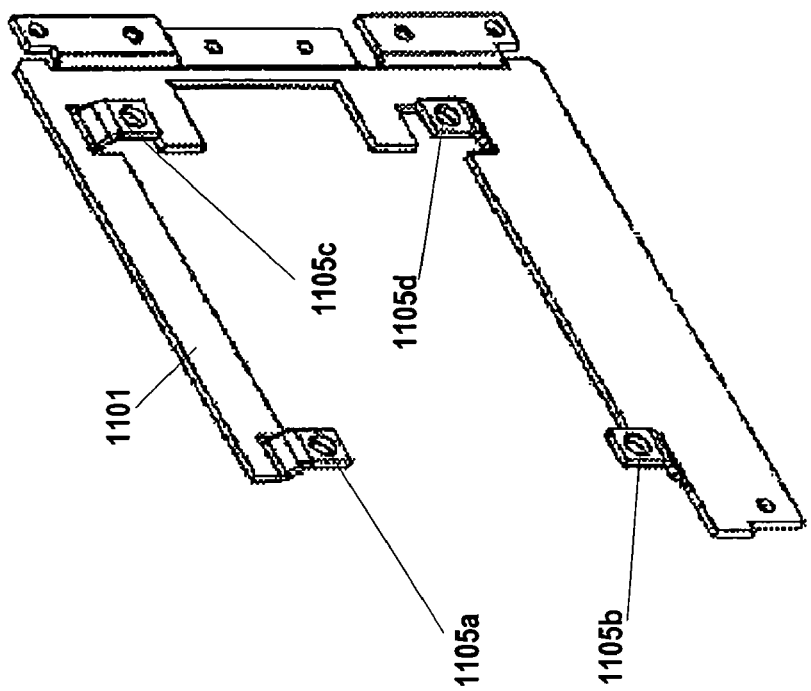
FIGS. 11a and 11b illustrate two views of a mechanical adapter for a PXI module, according to an embodiment.
Figure 11A:
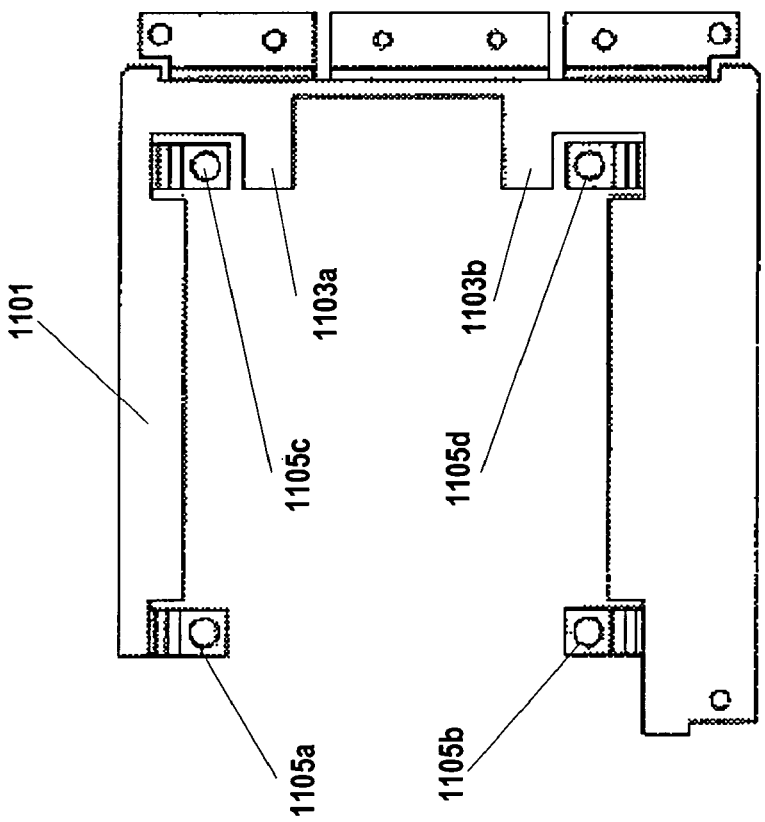

FIGS. 11a and 11b illustrate an embodiment of an asymmetric mechanical adapter 1101. In some embodiments, the mechanical adapter 1101 may be configured to fit a specific daughtercard. The mechanical adapter 1101 may be asymmetric and may be configured with various tabs 1105 and supportive portions 1103. In some embodiments, the tabs 1105 may be offset on either side of the mechanical adapter 1101.

Figure 12B:
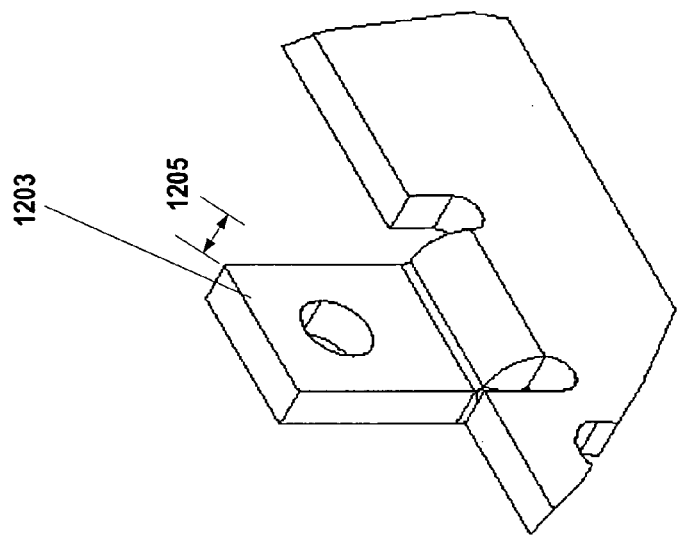
FIGS. 12a and 12b illustrate a mechanical adapter with tabs offset in a first direction to accommodate a printed circuit board (PCB), according to an embodiment.
Figure 12A:
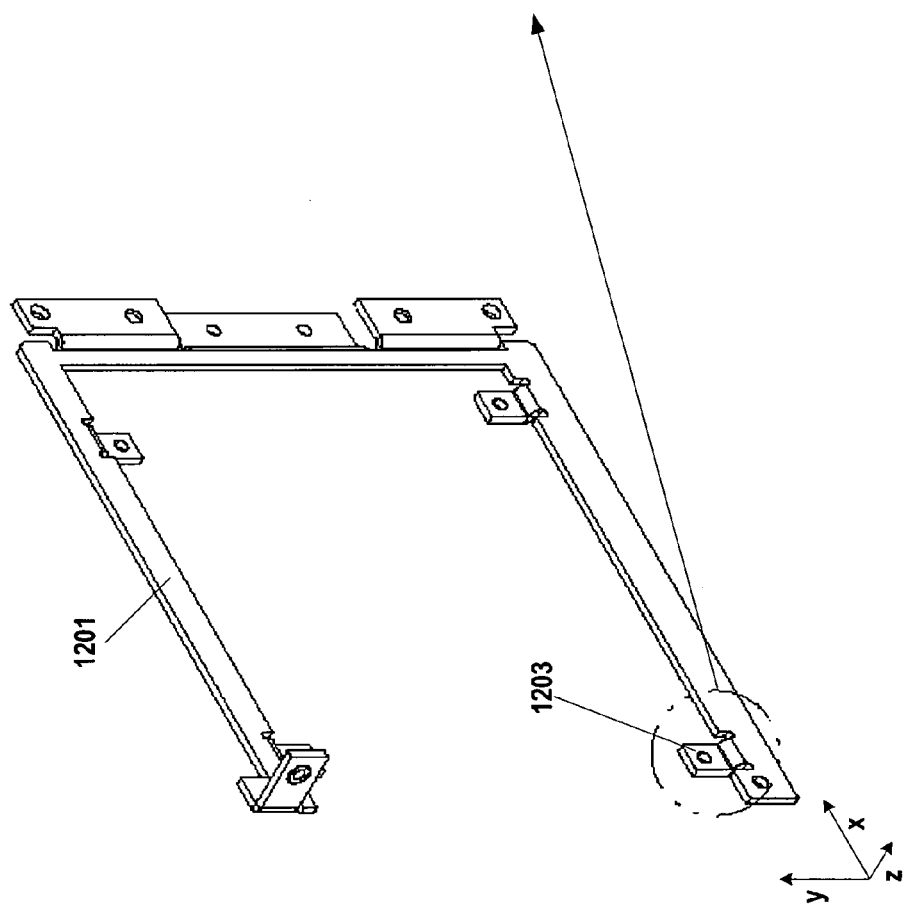

FIGS. 12a and 12b illustrate an embodiment of a mechanical adapter 1201 with tabs 1203. In some embodiments, a tab 1203 may be offset to accommodate a daughtercard. For example, an offset 1205 (in FIG. 12b) may be adjusted according to an overall width in the z-axis of a daughtercard or other printed circuit board to be coupled to the mechanical adapter.

Figure 13B:
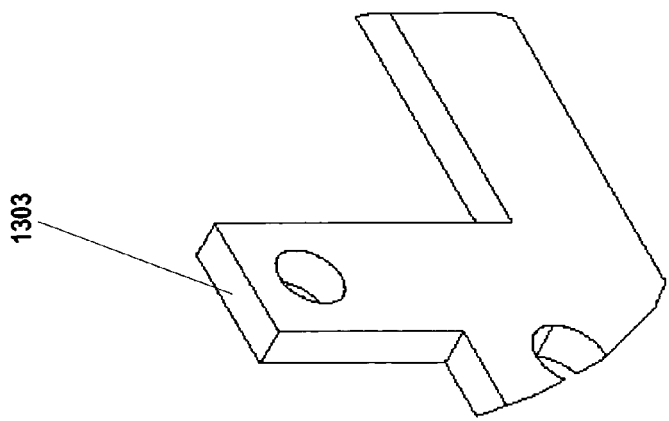
FIGS. 13a and 13b illustrate a mechanical adapter with a flat tab, according to an embodiment.
Figure 13A:
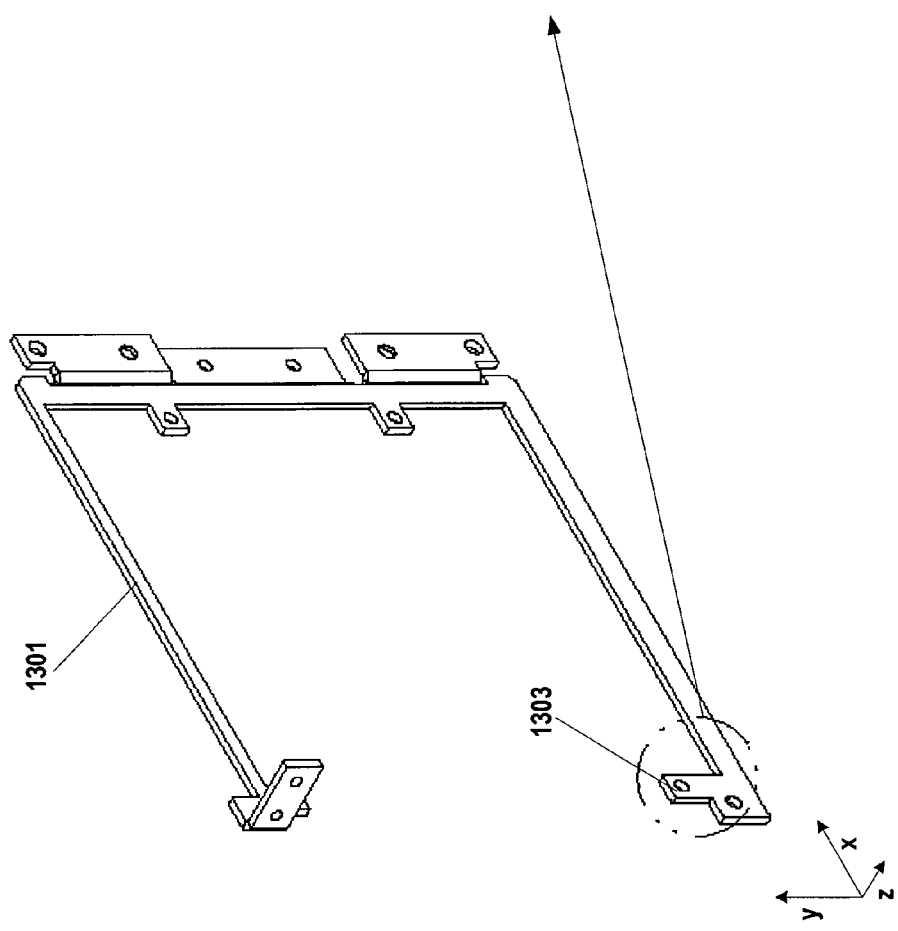

FIGS. 13a and 13b illustrate an embodiment of a mechanical adapter 1301 with a flat tab 1303. In some embodiments, a flat tab 1303 may be used. In some embodiments, the overall width of the daughtercard (i.e., along the z-axis) may also be accommodated through a fastener (e.g., a larger or smaller fastener may be used to accommodate the overall width of the daughtercard).

Figure 14B:
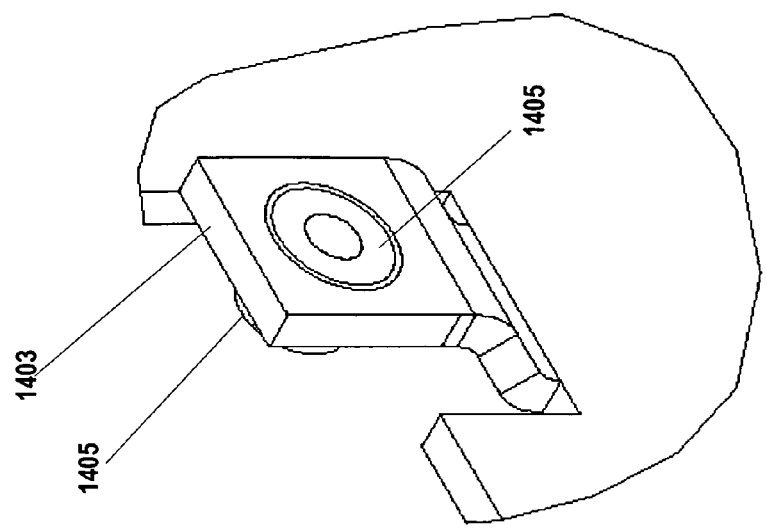
FIGS. 14a and 14b illustrate a mechanical adapter with tabs offset in a second direction, according to an embodiment.
Figure 14A:
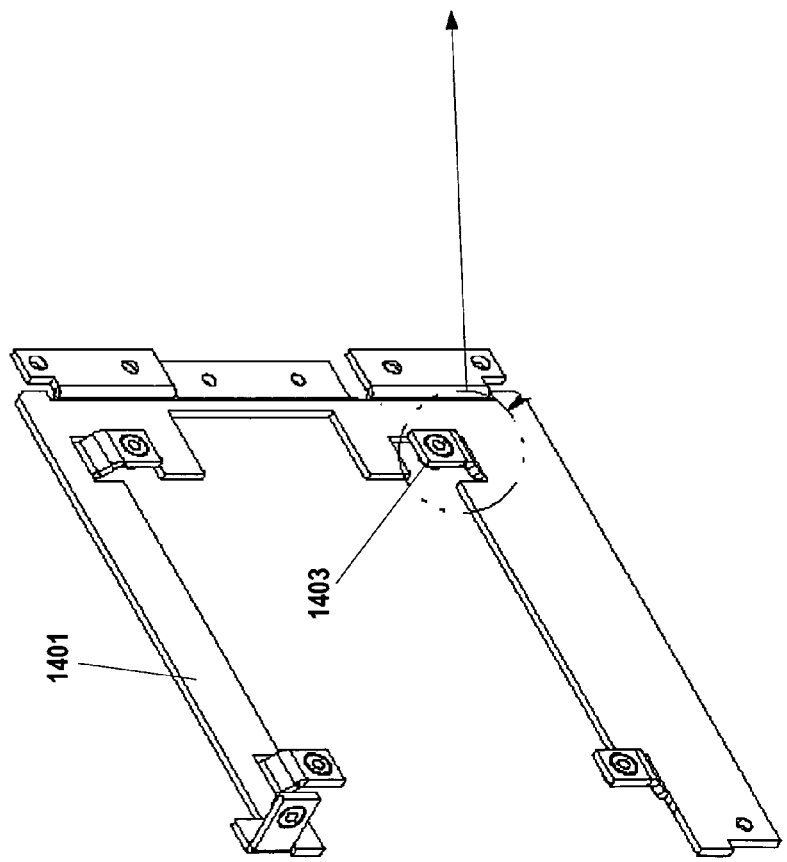

FIGS. 14a and 14b illustrate an embodiment of a mechanical adapter 1401 with tabs 1403. In various embodiments, the shape of the mechanical adapter 1401 may be configured according to a shape of a PCB received into the mechanical adapter 1401. For example, the mechanical adapter 1401 may substantially surround a PCB received into the mechanical adapter 1401. As seen in FIG. 14b, threaded inserts 1405 may be used in holes of the tabs 1403 to provide more threads for a screw when fastening the mechanical adapter 1401 to a daughtercard. In some embodiments, the threaded insert 1405 may extend through the daughtercard. In some embodiments, a threaded insert 1405 may not be used. In some embodiments, the mechanical adapter may be threaded directly.

FIG. 15a, 15b, and 15c illustrate a mechanical adapter with a complex bent tab, according to an embodiment. The mechanical adapter 1501 may be configured with complex shaped features. For example, features such as the complex bent tab 1503 may accommodate complex features (e.g., a large input/output connector) on a daughtercard and/or on hardware interfacing with the module (e.g., the chassis). In some embodiments, the circular partial-shear feature 1505 may be used to displace the mechanical adapter material enough to accommodate various hardware (e.g., off-the-shelf standoff hardware) rather than having to use custom hardware.

Figure 16A:
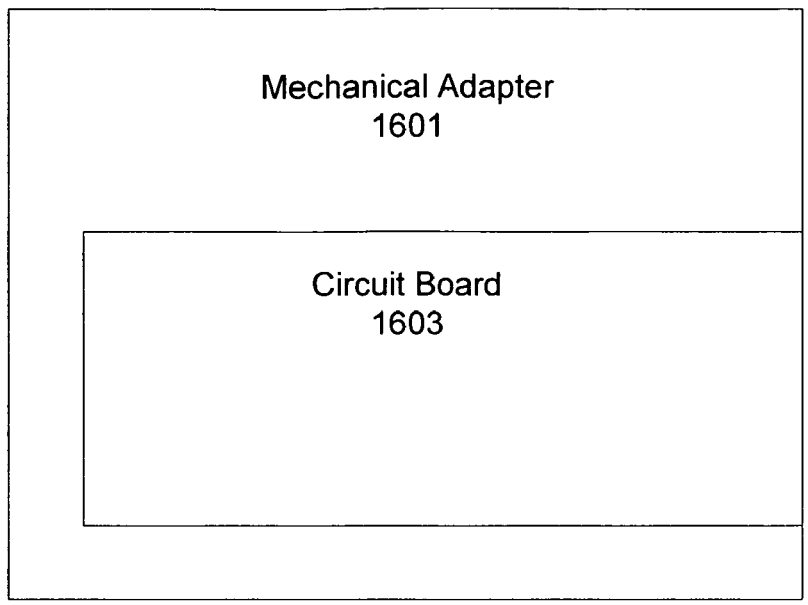
FIGS. 16a and 16b illustrate a mechanical adapter, according to an embodiment.
Figure 16B:
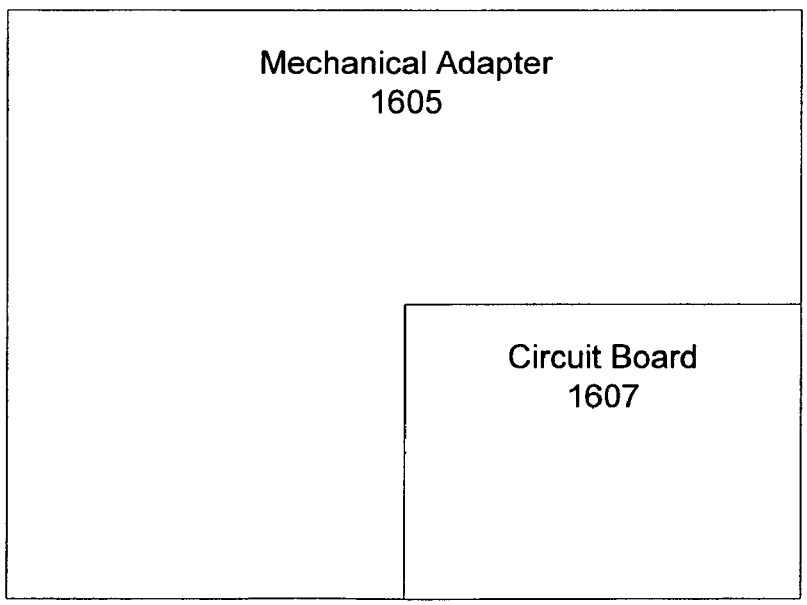

FIGS. 16a and 16b illustrate a mechanical adapter, according to further embodiments. It is to be understood that other configurations of the mechanical adapter are also contemplated. For example, as seen in FIG. 16a, the mechanical adapter 1601 may couple to a circuit board 1603 that may occupy an interior region of the mechanical adapter 1601. In some embodiments, the circuit board 1607 may couple at a corner of the mechanical adapter 1605. Other configurations of the mechanical adapter are also contemplated.

Figure 17:
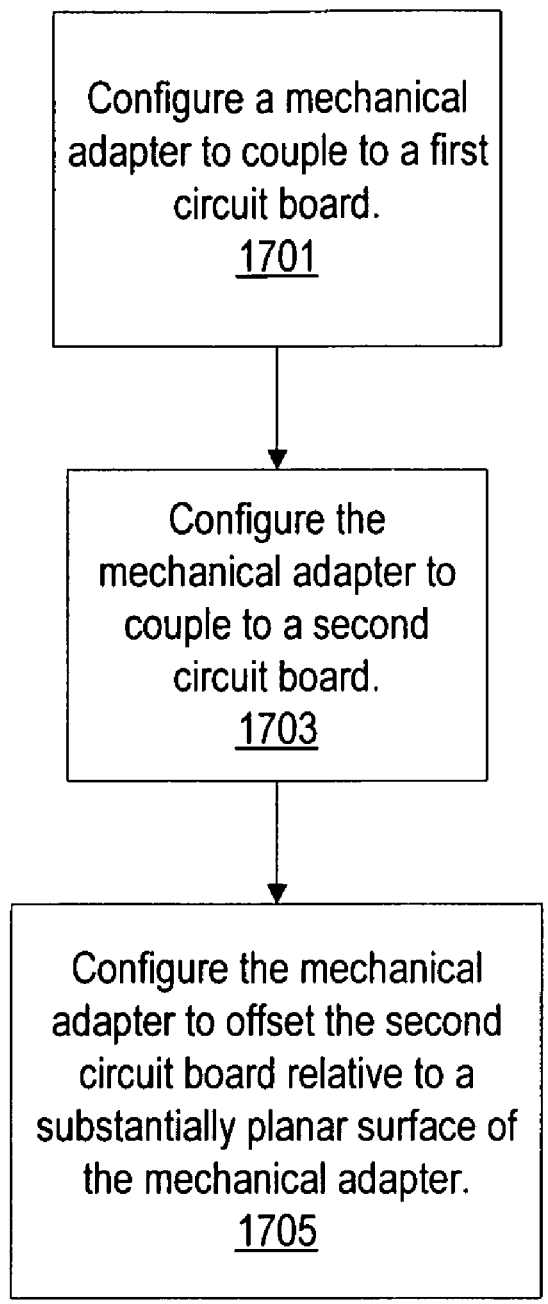
FIG. 17 illustrates a method of configuring a mechanical adapter, according to an embodiment.

FIG. 17 illustrates a method of configuring a mechanical adapter, according to an embodiment.

At 1701, a mechanical adapter may be configured to couple to a first circuit board (e.g., a PXI or SCXI motherboard).

At 1703, the mechanical adapter may be configured to couple to a second circuit board (e.g., a daughtercard). For example, the mechanical adapter may have features such as tabs fabricated into the mechanical adapter. In some embodiments, the tabs may be bent and/or offset to accommodate the second circuit board.

At 1705, the mechanical adapter may be configured to offset the second circuit board relative to a substantially planar surface of the mechanical adapter (e.g., to align with the first circuit board and/or a front plate). The second circuit board may be coupled to the mechanical adapter. The mechanical adapter may also be coupled to the first circuit board. In some embodiments, an overall width of the mechanical adapter and second circuit board may not exceed a predetermined value when the second circuit board is coupled to the mechanical adapter.

Further modifications and alternative embodiments of various aspects of the invention may be apparent to those skilled in the art in view of this description. Accordingly, this description is to be construed as illustrative only and is for the purpose of teaching those skilled in the art the general manner of carrying out the invention. It is to be understood that the forms of the invention shown and described herein are to be taken as embodiments. Elements and materials may be substituted for those illustrated and described herein, parts and processes may be reversed, and certain features of the invention may be utilized independently, all as would be apparent to one skilled in the art after having the benefit of this description of the invention. Changes may be made in the elements described herein without departing from the spirit and scope of the invention as described in the following claims.

We claim:

1. An apparatus, comprising:
a first circuit board, wherein the first circuit board has at least one first connector for mating with at least one corresponding connector in a backplane of a chassis;
a mechanical adapter, comprising:
a mounting portion coupling the mechanical adapter to the first circuit board; and
a configurable portion, coupled to the mounting portion;
a front plate coupled to the configurable portion; and
a locking member coupled to the front plate;
wherein when the mechanical adapter and coupled first circuit board combination are inserted into a slot of the chassis, the at least one first connector mates with the at least one corresponding connector in the backplane of the chassis, and wherein the locking member is operable to engage the chassis;
wherein the configurable portion of the mechanical adapter is operable to mount to a second circuit board;
wherein the mechanical adapter has a substantially planar surface with a substantially planar opening which includes a coupling mechanism for coupling to at least two peripheral edges of the second circuit board;
wherein the substantially planar opening passes through the substantially planar surface.

2. The mechanical adapter of claim 1, wherein the mechanical adapter comprises sheet metal.

3. The apparatus of claim 1, wherein the coupling mechanism comprises at least one tab.

4. The apparatus of claim 1, wherein a length of the mechanical adapter plus a length of the first circuit board substantially equals a length of the chassis.

5. An apparatus, comprising:
a motherboard;
a mechanical adapter coupled to the motherboard, wherein the mechanical adapter comprises:
a mounting portion for mounting the mechanical adapter to the motherboard; and
a configurable portion, coupled to the mounting portion, wherein the configurable portion comprises a substantially planar surface;
a daughtercard coupled to the configurable portion of the mechanical adapter, and
wherein the configurable portion of the mechanical adapter includes an offset coupling mechanism for coupling the daughtercard in such a way that the daughtercard can be offset relative to the substantially planar surface;
wherein the substantially planar surface has a substantially planar opening passing through the substantially planar surface;
wherein the offset coupling mechanism couples the daughtercard substantially parallel to the substantially planar opening.

6. The apparatus of claim 5, wherein the motherboard is a PXI module interface.

7. The apparatus of claim 5, wherein the motherboard is a SCXI module interface.

8. The apparatus of claim 5, wherein the mechanical adapter is coupled to the motherboard through a protrusion and slot coupling.

9. The apparatus of claim 5, wherein at least one of the mechanical adapter or the motherboard is inserted into at least two alternating mounting tabs on the other of the mechanical adapter or the motherboard wherein the alternating mounting tabs at least partially constrain the motherboard along at least one dimension when the motherboard is coupled to the mechanical adapter.

10. The apparatus of claim 5, wherein the mechanical adapter comprises sheet metal.

11. The apparatus of claim 5, wherein the offset coupling mechanism comprises at least one tab.

12. An apparatus, comprising:
a first circuit board, wherein the first circuit board has at least one first connector for mating with at least one corresponding connector in a backplane of a chassis;
a mechanical adapter, comprising:
a mounting portion coupling the mechanical adapter to the first circuit board; and
a configurable portion, coupled to the mounting portion; and
wherein when the mechanical adapter and coupled first circuit board are inserted into a slot of the chassis the at least one first connector mates with the at least one corresponding connector in the backplane of the chassis
wherein the apparatus further comprises a second circuit board coupled to the mechanical adapter;
wherein the mechanical adapter has a substantially planar surface with a substantially planar opening which includes a coupling mechanism for coupling to at least two peripheral edges of the second circuit board;
wherein the substantially planar opening passes through the substantially planar surface.

13. The apparatus of claim 12, wherein the substantially planar surface is substantially parallel to a planar surface of the first circuit board.

14. The apparatus of claim 12, wherein the configurable portion has a length such that when the mechanical adapter and coupled first circuit board combination are inserted into a slot of the chassis, the mechanical adapter and coupled first circuit board combination extends a full length of the chassis slot.

15. The apparatus of claim 12, wherein the mechanical adapter comprises sheet metal.

16. The apparatus of claim 12, further comprising a front plate coupled to the mechanical adapter, wherein the mechanical adapter is configured to position the second circuit board relative to the front plate.

17. The apparatus of claim 12, wherein the configurable portion is configured to couple to the second circuit board such that a minimum overall dimension of the mechanical adapter and the second circuit board is less than a predetermined value.

18. The apparatus of claim 12, wherein the first circuit board is a Peripheral Component Interconnect (PCI) Extensions for Instrumentation (PXI) interface.

19. The apparatus of claim 12, wherein the first circuit board is a Signal Conditioning Extensions for Instrumentation (SCXI) module interface.

20. The apparatus of claim 12, wherein the coupling mechanism comprises at least one tab.

21. The apparatus of claim 12, wherein a length of the mechanical adapter plus a length of the first circuit board substantially equals a length of the chassis.

22. An apparatus, comprising:
a first circuit board;
a mechanical adapter coupled to the first circuit board, wherein the mechanical adapter comprises:
a mounting portion for mounting the mechanical adapter to the first circuit board; and
a configurable portion, coupled to the mounting portion, wherein the configurable portion comprises a substantially planar surface;
a second circuit board coupled to the configurable portion of the mechanical adapter; and
wherein the configurable portion of the mechanical adapter includes an offset coupling mechanism for coupling the second circuit board in such a way that the second circuit board can be offset relative to the substantially planar surface;
wherein the substantially planar surface has a substantially planar opening passing through the substantially planar surface;
wherein the offset coupling mechanism couples the second circuit board substantially parallel to the substantially planar opening.

23. The apparatus of claim 22, wherein the offset coupling mechanism comprises at least one tab.

24. The apparatus of claim 22, further comprising:
a front plate coupled to the mechanical adapter;
an electrical connector coupled to the second circuit board;
wherein the mechanical adapter aligns the electrical connector coupled to the second circuit board with a receiving portion on the front plate.

25. The apparatus of claim 22, wherein the first circuit board is a Peripheral Component Interconnect (PCI) Extensions for Instrumentation (PXI) interface.

26. The apparatus of claim 22, wherein the first circuit board is a Signal Conditioning Extensions for Instrumentation (SCXI) module interface.

27. The apparatus of claim 22, wherein the mechanical adapter is coupled to the first circuit board through a protrusion and slot coupling.

28. The apparatus of claim 22, wherein the mechanical adapter is coupled to the first circuit board through fasteners including at least one of a screw, rivet, or a snap.

29. The apparatus of claim 22, wherein at least one of the mechanical adapter or the first circuit board is inserted into at least two alternating mounting tabs on the other of the mechanical adapter or the first circuit board wherein the alternating mounting tabs at least partially constrain the first circuit board along at least one dimension when the first circuit board is coupled to the mechanical adapter.

30. The apparatus of claim 22, wherein the second circuit board includes at least two printed circuit boards stacked relative to each other and wherein the mechanical adapter includes at least one additional piece to couple the second circuit board to the mechanical adapter.

31. The apparatus of claim 22, wherein the mechanical adapter comprises sheet metal.

32. The apparatus of claim 22, wherein the offset coupling mechanism couples the second circuit board at least partially in the substantially planar opening.

33. The apparatus of claim 22, wherein the offset coupling mechanism offsets the second circuit board such that an overall width of the mechanical adapter and the second circuit board is less than a predetermined value.

34. The apparatus of claim 22, wherein the offset aligns a surface of the second circuit board with the substantially planar surface of the mechanical adapter.

35. The apparatus of claim 24, wherein the receiving portion on the front plate comprises a hole.

36. The apparatus of claim 27, wherein the protrusion is on one of the mechanical adapter or the first circuit board and fits into the slot on the other of the mechanical adapter or the first circuit board such that when the protrusion is in the slot, the mechanical adapter and the first circuit board are substantially aligned along at least one dimension.

* * * * *